(12) United States Patent
Thust et al.

(10) Patent No.: US 9,076,630 B2
(45) Date of Patent: Jul. 7, 2015

(54) ELECTRON MICROSCOPE AND A METHOD FOR MEASURING THE DEFOCUS VARIATION OR THE LIMIT RESOLUTION

(75) Inventors: Andreas Thust, Cologne (DE); Juri Barthel, Erkelenz (DE)

(73) Assignee: Forschungszentrum Juelich GmbH, Juelich (DE)

( * ) Notice: Subject to any disclaimer, the term of this patent is extended or adjusted under 35 U.S.C. 154(b) by 1309 days.

(21) Appl. No.: 12/448,038

(22) PCT Filed: Dec. 13, 2007

(86) PCT No.: PCT/DE2007/002252
§ 371 (c)(1),
(2), (4) Date: Jun. 4, 2009

(87) PCT Pub. No.: WO2008/074302
PCT Pub. Date: Jun. 26, 2008

(65) Prior Publication Data
US 2010/0032565 A1 Feb. 11, 2010

(30) Foreign Application Priority Data
Dec. 21, 2006 (DE) .......................... 10 2006 061 978

(51) Int. Cl.
*H01J 37/06* (2006.01)
*H01J 37/26* (2006.01)

(52) U.S. Cl.
CPC ....... *H01J 37/263* (2013.01); *H01J 2237/2823* (2013.01)

(58) Field of Classification Search
USPC ................................. 250/306, 307, 310, 311
See application file for complete search history.

(56) References Cited

U.S. PATENT DOCUMENTS

| 5,300,776 A * | 4/1994 | Krivanek ...................... 250/307 |
| 6,885,442 B1 * | 4/2005 | Nugent et al. ................. 356/121 |
| 2003/0201393 A1 | 10/2003 | Tsuneta et al. |

FOREIGN PATENT DOCUMENTS

| DE | 32 35 101 | 3/1984 |
| JP | 7-114901 | 5/1995 |
| JP | 2002260571 | 9/2002 |

OTHER PUBLICATIONS

Nachweis von Objektbewegungen im lichtoptischen Diffraktogramm von elektronenmikroskopischen Aufnahmen Von J. Frank; Jul. 7, 1969.

(Continued)

*Primary Examiner* — Nicole Ippolito
*Assistant Examiner* — Hanway Chang
(74) *Attorney, Agent, or Firm* — Jordan and Hamburg LLP

(57) ABSTRACT

An electron microscope and a method for measuring the defocus spread or the limiting resolution of an electron microscope takes advantage of the fact that, in the case of tilted illumination, any aberration that may be present and the defocus spread of the electron microscope anisotropically change the intensity distribution in the diffractogram. In particular, the envelope of the diffractogram is anisotropically narrowed. If both the tilt of the electron beam and any aberration that may be present are known, and the focus distribution is assumed to be Gaussian-shaped, the defocus spread of the electron microscope is the only parameter still unknown that influences the anisotropic changes in intensity distribution. Quantitative conclusions as to the defocus spread can thus be drawn from the changes. However, the focus distribution can also be determined from the anisotropic narrowing without the use of a model, and without a priori assumptions about the shape thereof. In this way, the limiting resolution of the electron microscope can be determined.

35 Claims, 8 Drawing Sheets

(56) References Cited

OTHER PUBLICATIONS

Saxton W O: "Aberration measurement and compensation for near-1 A microscopy" Proceedings of EMAG '95 Sept. 12-15, 1995; Birmingham, UK, 1995, pp. 73-78, XP009099622 Electron Micrscopy and Analysis 1995. Proceedings of the Institute of Physics. Electron Microscopy and Analysis Group Conference IOP Publishing Bristol, UK ; ISBN: 0-7503-0357-3; pp. 74-75, 78 & Database Inspec [Online] The Institute of Electrical Engineers, Stevenage, GB; Database accession No. 5218343.

Frank J et al: "Note on the Effect of Illumination Aperture and Defocus Spread in Brightfield Electron Microscopy" Optik (Stuttgart) Nov. 1978, vol. 52, No. 1, Nov. 1978, pp. 49-60, XP009099667 abstract Abschnitte "5. Tilted specimen experiments" bis "7. An alternative method . . ." & Database Compendex [Online] Engineering Information, Inc., New York, NY, US; Database accession No. EIX79060008552.

Zemlina J et al: "Diffractogram tableaux by mouse click" Ultramicroscopy, Amsterdam, NL, vol. 93, Jan. 1, 2002, pp. 77-82, XP007903133 ISSN: 0304-3991 ; Abschnitt "1. Introduction".

Hanssen K-J et al: "The influence of voltage and current fluctuations and of a finite energy width of the electrons on contrast and resolution in electron microscopy" Optik, Wissenschaftliche Verlag GmbH, Stuttgart, vol. 32, No. 6, Jan. 1, 1971, pp. 519-538, XP009099659; ISSN: 0030-4026; the whole document.

Determination of image aberrations in high-resolution electron microscopy using diffractogram and cross-correlation methods D. Typke, K. Dierksen Max-Planek-Institut fuer Biochemic, Martinsried, Germany Optic 99. No. 4 (1995) pp. 155-166 Wissenschuftliche Verlagesgesellschaft mbH, Stuttgart.

A method for determining the coeeficient of spherical aberration from a single electron micrograph. O.L. Krivanek—Covendish Laboratory, Cambridge Optik 45 (1970) No. 1, 97-101.

Residual Wave Aberrations in the First Spherical Aberration Corrected Transmission Electron Microscope Stephan Uhlemann, Maximilian Haider EMBL Heidelberg, PF 102209, D-69012 Heidelberg, Germany; received in revised form Oct. 2, 1997 Ultramiscroscopy 72 (1998) 109-119 1998 Elsevier Science B.V.

Breaking the Spherical and Chromatic Aberration Barrier in Transmission Electron Microscopy B. Freitag, S. Kujawa, P.M. Mul, J. Ringnalda, P.C. Tiemeijer FEI Electron Optics, PO Box 80066, 5600 KA Eindhoven, The Netherlands; received in revised form Sep. 24, 2004; accepted Sep. 28, 2004 Ultramiscroscopy 102 (2005) 209-214 2004 Published by Elsevier B.V.

* cited by examiner

Δ = 0 nm      Δ = 5 nm      Δ = 10 nm (a)      (b)

ELECTRON MICROSCOPE AND A METHOD FOR MEASURING THE DEFOCUS VARIATION OR THE LIMIT RESOLUTION

The invention relates to an electron microscope and to a method for measuring the defocus spread or the limiting resolution of an electron microscope.

BACKGROUND OF THE INVENTION

In an electron microscope, the object to be observed is illuminated by an electron beam. The radiation reflected by the object, or transmitted through the object, or secondary electrons emitted by the object, are focused to form a magnified picture of the object by means of electromagnetic lenses. The best achievable resolution (limiting resolution or information limit) of the object structure is physically limited by partial temporal (longitudinal) coherence of the electron beam and, in modern microscopes this is in the range of less than one angstrom. From (K. J. Hansen, L. Trepte, Der Einfluss von Strom-und Spannungsschwankungen, sowie der Energiebreite der Strahlelektronen auf Kontrastubertragung und Auflosung des Elektronenmikroskops [The influence of current and voltage fluctuations and the energy width of beam electrons on electron microscope contrast transmission and resolution], Optik 32, 519 (1971)) and (K. Ishizuka, Contrast transfer of crystal images in TEM, Ultramicroscopy 5, 55-65 (1980)) it is known that partial temporal coherence of the electron beam is substantially caused by the finite energy width of the beam electrons, temporal fluctuations in the accelerating voltage, and temporal fluctuations in the current in the electromagnetic lenses.

The limiting resolution is of fundamental importance for assessing the reliability of pictures taken with electron microscopes. The limiting resolution is defined by the defocus spread.

The defocus spread, and thus indirectly the limiting resolution, is traditionally determined based on diffractograms of thin amorphous objects, under central illumination of the object. A diffractogram is an optically or digitally produced Fourier transform of an electron-optical image. The intensity distribution of these diffractograms depends on the concrete effective cross-sections for the diffraction of electrons in the object, the object thickness, and the modulation transfer function of the detector used for imaging. Since these parameters are, in practice, largely unknown, the diffractograms cannot be quantitatively evaluated, which is disadvantageous.

The "Young's fringe" method for improving the visibility of imaging contrasts is known from (J. Frank, Nachweis von Objektbewegungen im lichtoptischen Diffraktogramm von elektronenmikroskopischen Aufnahmen [Detection of object movements in photo-optical diffractograms of electron microscope images], Optik 30, 171 (1969)). Here, two consecutively taken pictures of a thin amorphous object are superimposed with a slight displacement. The diffractogram of this superimposition shows a conspicuous line pattern. The spatial frequency at which this line pattern can no longer be differentiated from the noise defines the limiting resolution of the electron microscope. This is evaluated based on qualitative visibility criteria.

A disadvantage is that this method is dependent on a subjective assessment by the observer. In addition, the visibility of the line pattern depends on the amplification properties of the detector and also on whether the intensities in the diffractogram are shown on a linear or logarithmic scale. The limiting resolution determined with this method is therefore subject to very large errors that cannot be limited.

Furthermore, the traditional "Young's fringe method" has the disadvantage that it cannot be used to differentiate between linear and non-linear contrasts, and that non-linear contrast fractions under certain conditions can simulate a far better limiting resolution than is actually present. With the traditional Young's fringe method, significant systematic errors of up to 50% of the actual limiting resolution may occur, particularly at low accelerating voltages, due to the non-linear effect.

SUMMARY OF THE INVENTION

Thus, the object of the invention is to allow the defocus spread and the limiting resolution of electron microscopes to be determined quantitatively in an objectifiable manner.

This object is achieved according to the invention by an electron microscope according to the main claim and by a method according to the additional independent claim. Further advantageous embodiments are apparent from the dependent claims referring to these claims.

As part of the invention, an electron microscope was developed. It comprises means for tilting the electron beam and means for determining the anisotropy of the intensity distribution of diffractograms.

A diffractogram as defined in this invention shall be understood as the representation of a picture taken with the electron microscope in the spatial frequency space.

According to the invention, an evaluation unit is provided, which, in conjunction with the tilting of the electron beam, is able to use the anisotropy of the intensity distribution of at least one diffractogram taken with the microscope in order to determine the defocus spread or the focus distribution of the electron microscope, the 'or' being non-exclusive.

It was found that the limiting resolution of an electron microscope can be determined equally from the focus distribution and from a mathematical model for this focus distribution, which uses the focus spread as a parameter.

A determination of the focus distribution shall be understood as any acquisition of information about the focus distribution, particularly an acquisition of information in a quantity that is sufficient to determine the limiting resolution of the electron microscope from the focus distribution. It is not necessary for the focus distribution to be available as an analytical formula. It is sufficient, for example, if the value thereof is determined on a discrete number of points, or if the approximate course thereof is determined by fitting a functional approach using parameters to experimental data.

It was found that the defocus spread of the electron microscope results in an anisotropic change in the intensity distribution in the diffractogram when the illumination is tilted. For example, the envelope of the diffractogram is narrowed anisotropically.

Both the defocus spread and the focus distribution are variables that constitute a measure of the limiting resolution of the electron microscope and can be determined from the anisotropic narrowing of the envelopes of the diffractogram. As the evaluation unit allows these variables to be determined individually, or in combination, it can also supply a measure of the limiting resolution of the electron microscope.

Here, the defocus spread and focus distribution are linked from a technical point of view. The defocus spread is the width of the focus distribution, wherein the definition of the width depends on the shape of the focus distribution and can, in principle, be freely selected. For example, the width of a Gaussian distribution is considered to be the full width at half the maximum of this distribution. In this way, the defocus spread can be determined from the focus distribution; however, it is not possible to determine the focus distribution from the defocus spread.

The defocus spread, however, can also be determined without having knowledge of the focus distribution, directly from experimental data, by fitting a mathematical model, in which the focus distribution is assumed, for example, to be a Gaussian distribution, to this data, with the defocus spread being a free parameter.

If the tilting of the electron beam is known then, other that aberrations, the defocus spread of the electron microscope is the only parameter that is still unknown and that influences the anisotropic change of the intensity distribution. Thus, quantitative conclusions can be drawn regarding the defocus spread from the change, and particularly from the anisotropic narrowing of the envelopes of the diffractogram. For this purpose, it is advantageous if the diffractogram is taken with an amorphous object, as the specific properties thereof will only produce anisotropic changes in the intensity distribution.

The use of an evaluation unit that allows the focus distribution to be determined is based on the underlying finding that each electron contributes to the imaging of the object structure with slightly different defocusing. In this way, in each image many "sub-pictures" having slightly different contrasts are superimposed, and the result is a distorted picture of the object, in which the contrast of smaller structural details is more greatly attenuated than the contrast of larger structural details. Here, the attenuation of the contrast depends on the frequency of the defocusings Z contributing to the overall image. The frequency with which a sub-picture of a certain defocusing contributes to the result is described by a focus distribution f(Z). The attenuation of the contrast is ultimately determined by the Fourier transform $F(\xi)$ of the focus distribution, $\xi = \frac{1}{2}\lambda g^2$ being the focal frequency conjugated for defocusing. Here, $\lambda$ denotes the electron wavelength and g the spatial frequency, g=1/d, reciprocal to a distance d. The limiting resolution of an electron microscope is defined by the minimum distance $d_{info}$ of structural details, the linear imaging contrast $F(\xi_{info})$ of which, where $\xi_{info} = \lambda/(2d_{info}^2)$, is attenuated to a fraction $1/e^2 \approx 13.5\%$ of the maximum linear contrast F(0)=1. Here, $d_{info}$ is often referred to as the information limit of the electron microscope.

In a particularly advantageous embodiment of the invention, the electron microscope comprises means for determining at least one aberration of the electron microscope.

Aberrations, as defined in this invention, shall be understood in particular as defocusing, spherical aberration and astigmatism, and any combinations thereof. The term "aberrations", however, comprises all image defects that cause the picture supplied by the electron microscope to differ from an ideal image of the object structure. For example, strong spherical aberration results in distortion of local details of the object structure across wide ranges in the picture. Due to coma aberration, punctiform details of the object structure can appear elongated in the picture.

Means for determining an aberration are not only a measuring instrument for this aberration, but also a device, or a combination of a measuring instrument and a device, that is able to impart the aberration to the electron microscope at a known strength. For example, the electron microscope can have a setting option for defocusing. The defocusing setting option is implemented in a transmission electron microscope by an option for changing the objective lens current and by the option for displacing the object along the optical axis.

Aberrations are always present in electron microscope images, and thus are also present when measuring the defocus spread. Knowledge of the aberrations is not absolutely necessary for measuring the defocus spread. Since the aberrations due to the partial spatial coherence influence the envelope of the diffractogram, consideration of the same in a more accurate quantitative evaluation results in drastically increased accuracy.

In a particularly advantageous embodiment of the invention, the electron microscope is configured as a transmission electron microscope. In this case, the limiting resolution of the electron microscope only depends on the defocus spread and the electron wavelength. The evaluation unit can supply the defocus spread, and thus the limiting resolution, of the electron microscope.

Advantageously, the evaluation unit encompasses a low-pass filter for the diffractogram. In this way, fractions varying with the spatial frequency, which are not relevant for the determination of the defocus spread of the electron microscope, can quickly be removed from the diffractogram. Any type of low-pass filter may be used, and may for example be based on Fourier transformations or on wavelet transformations.

In a particularly advantageous embodiment of the invention, the evaluation unit encompasses at least one logarithmizing unit. This unit converts multiplicative interfering signals into additive interfering signals, for example in the high frequency fraction of a diffractogram separated by a low-pass filter, so that these signals can be separated from the useful signal by the same or a different low-pass filter.

The evaluation unit advantageously comprises a mathematical model for the intensity distribution of the diffractogram, and in particular a mathematical model for the low frequency fractions of the intensity distribution of the diffractogram, which are extracted by way of a low pass. One example of such a model is provided in the "Specific Description" section. The model can then be fitted to the intensity distribution actually present in the diffractogram, wherein the defocus spread to be determined can be used as a parameter. As a result, it becomes possible to determine the defocus spread in a way that is particularly tolerant toward measuring errors in the intensity distribution of the diffractogram. For example, the effect of outliers in the recorded intensity values can be reduced by fitting the model to the least squares method.

As part of the invention, a method for determining the defocus spread or limiting resolution of an electron microscope was developed, the 'or' being non-exclusive. In this method, the electron beam illuminating the object is tilted. At least one diffractogram is recorded on an object. The anisotropy of the intensity distribution of this diffractogram is determined.

According to the invention, the anisotropy of this intensity distribution and the tilting of the electron beam are used to evaluate the defocus spread or the focus distribution of the electron microscope, the 'or' being non-exclusive.

It was found that the limiting resolution of an electron microscope can be determined equally from the focus distribution and from a mathematical model for this focus distribution, which uses the focus spread as a parameter.

An evaluation of the focus distribution shall be understood as any acquisition of information about the focus distribution, particularly an acquisition of information in a quantity that is sufficient to determine the limiting resolution of the electron microscope from the focus distribution. It is not necessary for the focus distribution to be available as an analytical formula. It is sufficient, for example, if the value thereof is determined on a discrete number of points, or if the approximate course thereof is determined by tilting a functional approach using parameters to experimental data.

It was found that the defocus spread of the electron microscope anisotropically changes the intensity distribution in the diffractogram when the illumination is tilted. In particular, the envelope of the diffractogram is narrowed anisotropically.

Both the defocus spread and focus distribution are variables that constitute a measure of the limiting resolution of the electron microscope and can be determined from the anisotropic narrowing of the envelope of the diffractogram. The evaluation of these variables thus also supplies a measure of the limiting resolution of the electron microscope.

To this end, the defocus spread and focus distribution are linked from a technical point of view. The defocus spread is the width of the focus distribution, wherein the definition of the width depends on the shape of the focus distribution and can, in principle, be freely selected. For example, the width of a Gaussian distribution is considered to be the full width at half the maximum of this distribution. In this way, the defocus spread can be determined from the focus distribution; however, it is not possible to determine the focus distribution from the defocus spread.

The defocus spread can, however, also be determined without knowledge of the focus distribution, directly from experimental data by fitting a mathematical model, in which, for example, the focus distribution is assumed to be a Gaussian distribution, to this data, with the defocus spread being a free parameter.

If the tilt of the electron beam is known then, other than aberrations, the defocus spread of the electron microscope is the only parameter that is still unknown and that anisotropically changes the intensity distribution. In this way, quantitative conclusions can be drawn with respect to the defocus spread from the change, and particularly from the narrowing of the envelopes. For this purpose, it is advantageous if an amorphous object is selected as the specific properties thereof will only produce anisotropic changes in the intensity distribution.

The technical teaching for evaluating the focus distribution is based on the underlying finding that each electron contributes to the imaging of the object structure with slightly different defocusing. In this way, in each image many "sub-pictures" having slightly different contrasts are superimposed, and the result is a distorted picture of the object, in which the contrast of smaller structural details is more greatly attenuated than the contrast of larger structural details. Here, the attenuation of the contrast depends on the frequency of the defocusings Z contributing to the overall image. The frequency with which a sub-picture of a certain defocusing contributes to the result is described by a focus distribution f(Z). The attenuation of the contrast is ultimately determined by the Fourier transform $F(\xi)$ of the focus distribution, $\xi = \frac{1}{2}\lambda g^2$ being the focal frequency conjugated for defocusing. Here, $\lambda$ denotes the electron wavelength and g the spatial frequency, g=1/d, reciprocal to a distance d. The limiting resolution of an electron microscope is defined by the minimum distance $d_{info}$ of structural details, the linear imaging contrast $F(\xi_{info})$ of which, where $\xi_{info} = \lambda/(2d_{info}^2)$, is attenuated to a fraction $1/e^2 \approx 13.5\%$ of the maximum linear contrast F(0)=1. Here, $d_{info}$ is often referred to as the information limit of the electron microscope. The measurement of the limiting resolution is thus equivalent to the measurement of the focal distribution function f(Z).

Contrary to the evaluation of the defocus spread, the evaluation of the focus distribution is not tied to an assumed mathematical model for the focus distribution. Instead of a single parameter, which describes the width of an assumed Gaussian function, for example, a variety of values describing any arbitrary focus distribution can be obtained without parameters. Systematic measurement errors, which are caused by the fact that the shape of the focus distribution that is assumed for the data evaluation does not correspond to the shape of the focus distribution actually present during the measurement, are eliminated. The additional determination of the actually present focus distribution allows an even more accurate determination of the limiting resolution of a transmission electron microscope than is possible when only evaluating the defocus spread.

Compared to evaluation of the defocus spread alone, the evaluation of the focus distribution improves the accuracy with which the limiting resolution of the electron microscope can be determined as the deviation of the focus distribution from the Gaussian distribution increases. The deviation from the Gaussian distribution becomes particularly large in cases where the emission spectrum of the electron source is subsequently changed by means of a monochromator. An incorrectly assumed model for the focus distribution can result in systematic errors in the determination of the limiting resolution.

On the other hand, the evaluation of the focus distribution is an inverse problem, which is comparable to solving a system of linear equations, wherein the intensity values from the experimentally determined diffractogram are on the right side and the individual sub-pictures contributing thereto and the focuses thereof are on the left side. If the intensity values are subject to high noise, this noise may be amplified by the evaluation, in a manner similar to the effect that noise on the right side of a system of linear equations has on the solution thereof. The resulting inaccuracy in the limiting resolution that is determined from the focus distribution can, in the extreme case, be greater than the systematic inaccuracy, which is created during an evaluation of the limiting resolution by way of the defocus spread, in that the true focus distribution deviates from the Gaussian distribution.

In a particularly advantageous embodiment of the invention, the limiting resolution of the electron microscope is thus evaluated from the defocus spread or from the focus distribution.

In a particularly advantageous embodiment of the invention, at least one aberration of the electron microscope is determined. Aberrations shall be understood in particular as defocusing, spherical aberration and astigmatism, and any combinations thereof. The term "aberrations", however, encompasses all image defects that cause the picture supplied by the electron microscope to differ from an ideal image of the object structure.

Aberrations are always present in electronmicroscopic images and thus are also present when measuring the defocus spread. Knowledge of the aberrations is not absolutely necessary for measuring the defocus spread. Since the aberrations due to partial spatial coherence influence the envelope of the diffractogram, consideration of the same in a more accurate quantitative evaluation results in drastically increased accuracy.

This improvement can also be achieved if the focus distribution is evaluated in place of the defocus spread.

The determination of the aberration can be carried out passively, by measuring the aberration. This measurement can also be performed at the same time as the diffractogram is taken, for example with this very diffractogram also being used for the measurement of the aberration. For this purpose, the applicant developed a method, which is the subject matter of German Patent Application 10 2006 038 211.0. No additional data collection is required in order to take the aberration into consideration in the measurement of the defocus spread. In addition, the defocus spread that an electron microscope had at the time the diffractogram was taken can be reconstructed in retrospect from existing diffractograms.

The determination of the aberration can be carried out actively by imparting the aberration to the electron microscope at a known strength. For example, defined defocusing may be set. If the defocusing is the dominating aberration, this is advantageous in that the diffractogram has an intensity distribution that is substantially isotropic around the origin of the diffractogram. A larger area can then be used for an evaluation of the diffractogram on a circular path about the origin thereof.

Defocusing can be set in many electron microscopes by employing the same means used to set the focus in normal images. This setting is generally very accurate. Higher-quality electron microscopes have corrective mechanisms for spherical aberration, so that this can be zero. Astigmatism can also be reduced, or even eliminated, in many electron microscopes by stigmators.

The aberration that is imparted to the electron microscope at a known strength can expressly be different from those aberrations that re effective during the normal imaging operation of the electron microscope. For example, in order to determine the defocus spread, a combination of a defocusing of zero and high twofold astigmatism can be selected. In this configuration, normal images cannot be intuitively interpreted, but it is certainly possible to determine the defocus spread according to the invention.

A combination of passive and active determination of the aberration is also possible, which is to say based on the setting and measurement of the aberration. This is particularly advantageous if, for example, an aberration, which in principle can be set to a defined value, is subject to temperature-dependent drift.

In a particularly advantageous embodiment of the invention, the microscope selected is a transmission electron microscope. In this case, the limiting resolution of the electron microscope only depends on the defocus spread and the electron wavelength. The method then automatically supplies the limiting resolution, in addition to the defocus spread.

Advantageously, the diffractogram is filtered by way of a low-pass filter. In this way, fractions varying with the spatial frequency, which are not relevant for the determination of the defocus spread of the electron microscope, can be quickly removed from the diffractogram. As a result, the determination of the defocus spread can be automated with particular ease.

Advantageously, the diffractogram is logarithmized. For example, the high-frequency fraction of a diffractogram that is separated by a low-pass filter can be logarithmized. In this way, multiplicative interfering signals become additive interfering signals so that these signals can be separated from the useful signal by the same or a different low-pass filter.

In a particularly advantageous embodiment of the invention, the diffractogram is evaluated along a circular line around the origin thereof. All changes in the intensity detected during such an evaluation are attributed to anisotropic contributions to the intensity distribution. It is precisely these contributions that are determined by the tilting of the electron beam, any aberration that may be present, and the defocusing of the electron microscope. As a result, only these contributions are relevant for the determination of the defocus spread.

All rotation-symmetrical additive and multiplicative interfering signals that superimpose the useful signal are constants on a circular line and consequently do not influence the evaluation of the useful signal. When looking at the narrowed attenuation function on a circular line around the center of the diffractogram, two maxima and two minima are apparent. The attenuation function is the envelope of the intensity distribution, which has no pattern caused by coherent aberrations. The functional course of the intensity between the maxima and minima along such a circular path is defined by the magnification of the microscope, the angle of the beam tilt employed, and the focus distribution as part of a model of the imaging process. Since the magnification and beam tilt are known variables, the focus distribution is uniquely defined.

In a further advantageous embodiment of the invention, a mathematical model of the intensity distribution of the diffractogram is fitted to the recorded diffractogram, and in particular may be a model of the low-frequency fractions of this intensity distribution. One example of such a model is provided in the "Specific Description" section. The defocus spread to be determined can be used as a parameter. As a result, it becomes possible to determine the defocus spread in a way that is particularly tolerant of measuring errors in the intensity distribution of the diffractogram.

Advantageously, fitting is carried out with a parameter optimization method. For example, the effect of outliers in the recorded intensity values can be reduced by fitting the model using the least squares method. However, it is also possible to use any other fitting method, such as the Newton Raphson method, the Hooke-Jeeves method, genetic algorithms, or methods for maximizing the probability.

Advantageously, a sequence of at least three diffractograms, taken at different beam tilts, is evaluated in order to improve the accuracy of the determination of the defocus spread. For this purpose, the sequence of diffractograms, in particular with beam tilts, can be taken at the same angle relative to the optical axis of the electron microscope, but with uniform distribution in all azimuthal directions around the optical axis. This embodiment of the beam tilt series as a so-called azimuth tilt series allows the influence of additional, undesirable, anisotropic phenomena on the measurement result for the defocus spread to be minimized. Such undesirable anisotropic phenomena are, for example, object drift and object geometry. Since these phenomena likewise result in anisotropic narrowing of the envelopes of the intensity distribution in diffractograms, they can cause a systematic falsification of the measurement result in evaluations that are based on only a single diffractogram. By way of averaging across an azimuth tilt series, the narrowing resulting from the beam tilt can be separated from the narrowing resulting from the undesirable phenomena. The influence of the latter on the measurement result is thereby reduced.

These advantages of evaluating at least three diffractograms taken at different beam tilts can also be achieved if, in place of the defocus spread, the focus distribution is evaluated, because the anisotropy of the intensity distribution of the diffractogram is also used as a useful signal for this evaluation.

In a particularly advantageous embodiment of the invention, an equation system is prepared for evaluating the focus distribution, in which, for a number M of discrete points in the diffractogram, the intensity value of the diffractogram at this point is expressed as a function of the values of the focus distribution at a number N of different sub-focuses.

Each of the M discrete points contributes an equation having N unknown variables to this equation system. In particular, the M points can be distributed on one or more circular paths around the origin of the diffractogram. By using a suitable fitting or solution method, such as the least squares method, or the method according to the principle of maximum entropy, the values of the focus distribution at the N different sub-focuses can be determined as solutions of the equation system. The condition of the equation system, which is a measure of how sensitively the solutions respond to faults of the intensity values, can be controlled by way of the ratio of M to N.

Advantageously, a system of linear equations is prepared. To do so, the ring pattern can be removed from the diffractogram, for example by way of filtering the diffractogram using a low-pass filter.

Hereafter, the subject matter of the invention will be described in more detail based on one embodiment, without thereby limiting the subject matter of the invention.

DESCRIPTION OF THE PREFERRED EMBODIMENTS

In the case of electron microscope images, for each image many "sub-pictures" having slightly different contrasts are superimposed, due to the limited coherence of the electron beam, and the result is a distorted picture of the object, in which the contrast of smaller structural details is more greatly attenuated than the contrast of larger structural details. Assuming a Gaussian-like distribution of the defocus values found within an image, the attenuation of the contrast transfer is described by the following envelope:

$$E_t(g) = \exp\left[-\left(\frac{\pi\lambda\Delta}{2}\right)^2 g^4\right] \quad (1)$$

Here, $\lambda$ denotes the electron wavelength and g the spatial frequency, $g=1/d$, reciprocal to a distance d, while $\Delta$ quantifies the width of the defocus distribution. Hereafter, $\Delta$ shall be referred to as defocus spread. The limiting resolution of an electron microscope is defined by the minimum distance $d_{info}$ of structural details, the imaging contrast of which according to Equation (1) is only a fraction $1/e^2 \approx 13.5\%$ of the maximum contrast $E_r(0)=1$. Here, $d_{info}$ is referred to as the information limit of the electron microscope. In the case of a Gaussian-like defocus distribution in a transmission electron microscope, which is used in this embodiment, the information limit depends on the defocus spread $\Delta$, as follows:

$$d_{info} = \sqrt{\pi\lambda\Delta/(2\sqrt{2})}. \quad (2)$$

In order to quantify the limiting resolution of a transmission electron microscope, defocused diffractograms of images of a thin amorphous object taken with tilted illumination are analyzed. By using a thin amorphous object, electrons are scattered with identical probabilities in all directions around the direction of the incident electron beam. The scattering amplitude O(g) of the object decreases with large scattering angles. This scattering behavior applies equally to amorphous objects with tilted illumination and with axial illumination. In both cases, the square of the absolute value of the scattering amplitude $|O(g)|^2$ in the diffractogram is a rotation-symmetrical function, which decreases with increasing spatial frequency g.

Figure 1:
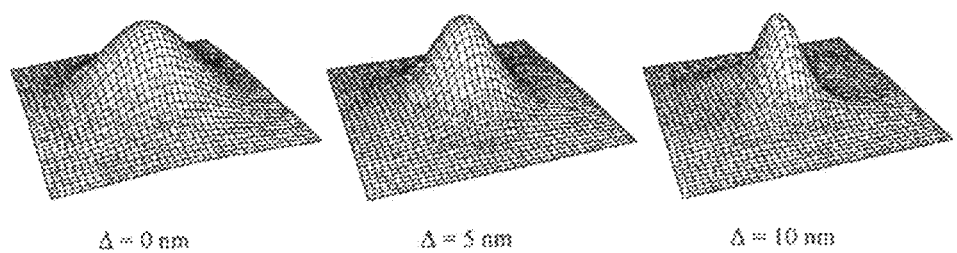
FIG. 1: Envelope of the intensity distribution in diffractograms of electron microscope images having constant-tilt illumination for three values of the defocus spread Δ

FIG. 1 shows the envelope of the intensity distribution in diffractograms of electron microscope images having constant-tilt illumination for three values of the defocus spread $\Delta$. Stronger anisotropic narrowing of the intensity distribution occurs for broader defocus distributions, due to the associated inferior partial temporal coherence of the electron beam. At the core, the invention is based on interpretation of the anisotropic narrowing as a useful signal and on the determination of the defocus spread $\Delta$ as well as the information limit (limiting resolution) therefrom.

For thin amorphous objects, a diffractogram of a defocused image shows a pattern comprising concentric rings, which become narrower as the spatial frequency increases. The distances of the rings depends on the strength Z of defocusing and depends quadratically on the spatial frequency g. Hereinafter, this ring pattern will be referred to as a "coherent ring pattern" because the geometric shape thereof does not depend on the coherence properties of the electron microscope.

Figure 2:
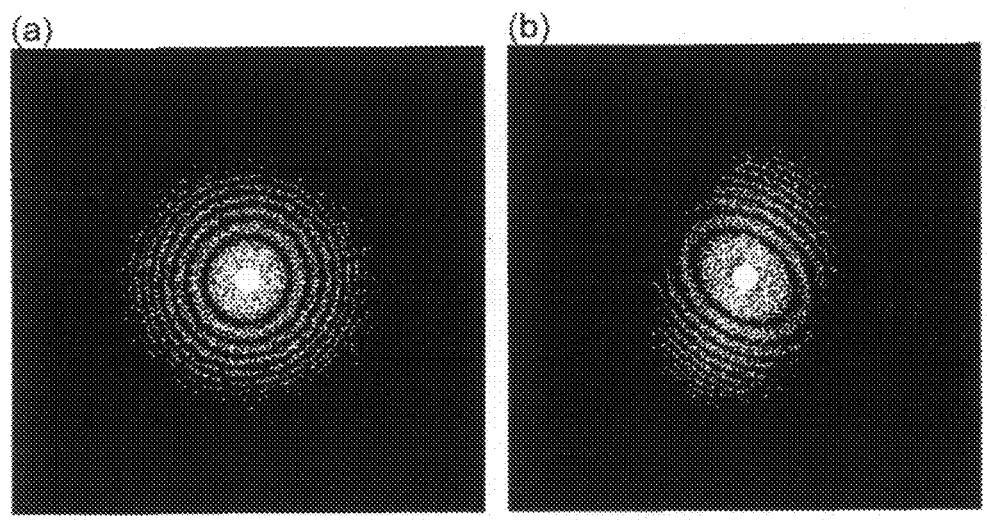
FIG. 2: Diffractograms of electron microscope images of a thin amorphous carbon film, with and without beam tilt.

FIG. 2 shows two diffractograms of electron microscope images of a thin amorphous carbon film. In panel a, the beam is not tilted. In panel b, the beam is tilted by 40 mrad.

In addition to the defocusing Z, the coherent ring pattern may also be dependent on the spherical aberration $C_s$ and the two components $A_{2x}$ and $A_{2y}$ of the twofold astigmatism. The coherent ring pattern is described by $\sin^2[\pi\chi(g_x,g_y)]$, where the aberration function $\chi(g_x,g_y)$ describes the total effect of the individual aberrations Z, $C_s$, $A_{2x}$ and $A_{2y}$ as a function of the diffraction vector $g=(g_x,g_y)$ according to the following equation:

$$\chi(g_x, g_y) = \frac{1}{2}Z\lambda(g_x^2 + g_y^2) + \frac{1}{2}A_{2x}\lambda g_x g_y + \frac{1}{4}C_s\lambda^3(g_x^2 + g_y^2)^2. \quad (3)$$

To this end, $\lambda$ denotes the electron wavelength. In order to simplify the description of the measurement method, here only the aberrations mentioned above will be addressed.

If the coefficients Z, $C_s$, $A_{2x}$ and $A_{2y}$ of the aberrations in Equation (3) are provided when the illumination is not tilted, then the coherent ring patterns varying quickly with strong defocusing Z over g are described for illumination by beam tilt t with $\sin^2[\Psi(g+t)]$. In addition to the ring pattern due to the aberrations, in diffractograms of thin amorphous objects with tilted illumination as in FIG. 2b several multiplicative and additive components occur, that vary slowly over g. The multiplicative, slowly varying components are the square of the absolute value of the object function $|O(g)|^2$, and the squares of the attenuation functions $E_t(g,t)$ and $E_s(g,t)$ due to the partial temporal and spatial coherence of the electron beam. The latter depend explicitly on the diffraction vector g and the beam tilt t.

An additive contribution of the shape $\sinh^2[A(g,t)]$ describes a subsurface varying slowly over g, which is explained by incomplete interference between diffracted and non-diffracted beams. The intensity distribution D(g) of a diffractogram with tilted illumination is described by the following equation:

$$D(g)=|O(g)|^2 \cdot E_s^2(g,t) \cdot E_t^2(g,t) \cdot \{\sin^2[2\pi\chi(g+t)]+\sinh^2[A(g,t)]\}. \quad (4)$$

Here, the temporal (longitudinal) attenuation function $E_t(g,t)$ and the spatial (transversal) attenuation function $E_s(g,t)$ are provided by:

$$E_t(g, t) = \exp\left\{-\left(\frac{\pi\Delta\lambda}{2}\right)^2 [g^4 + 4(g \cdot t)^2]\right\}, \quad (5)$$

$$E_s(g, t) = \exp\left\{-\left(\frac{\theta_0\lambda}{2}\right)^2 |\nabla\chi(g+t)|2\right\}. \quad (6)$$

The parameter $\theta_0$ denotes half the aperture angle of the incident beam cone of the illumination. The attenuation due to the partial spatial coherence of the electron beam further depends on the gradient of the aberration function $\chi(g+t)$ after the diffraction vector g. Since all aberrations taken into consideration in the aberration function can be metrologically quantified and/or can be specifically set on the electron microscope, the function $E_s(g,t)$ is basically known.

In the special case of disappearing aberrations, the gradient of the aberration function also disappears, and the function $E_s(g,t)$ is identical to 1.

The function A(g,t) has values different from zero only with tilted illumination:

$$A(g, t) = -\left(\frac{\pi\Delta\lambda}{2}\right)^2 4(g \cdot t) \cdot t^2. \quad (7)$$

A low-pass filter is applied to every diffractogram, so that the frequency spectrum of the quickly varying, coherent ring pattern is eliminated, while the frequency spectrum of the slowly varying components is maintained. After applying the low-pass filter, in general an average value of ½ remains of the coherent ring pattern after $\sin^2[\chi(g,t)]$ The result obtained is all the low-frequency fractions $D_{LF}(g,t)$ of the diffractogram which, based on Equation (4), are generally described by the following equation:

$$D_{LF}(g, t) = |O(g)|^2 \cdot E_s^2(g \cdot t) \cdot E_t^2(g, t) \cdot \left\{\frac{1}{2} + \sinh^2[A(g, t)]\right\}. \quad (8)$$

In the special case of disappearing aberrations, there is no quickly varying coherent ring pattern, and the constant ½ in Equation (8) becomes zero. In the special case of the Scherzer focus, where the broadest range of spatial frequencies is transmitted without a change in signs, the constant ½ in Equation (8) becomes 1.

Figure 3A:
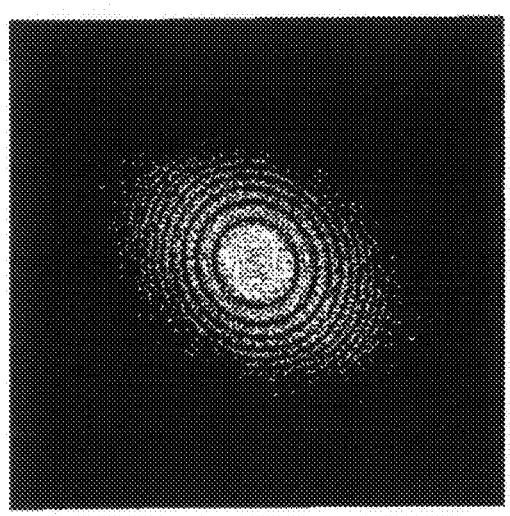
FIG. 3: Diffractogram and the low-frequency fractions thereof.
Figure 3B:
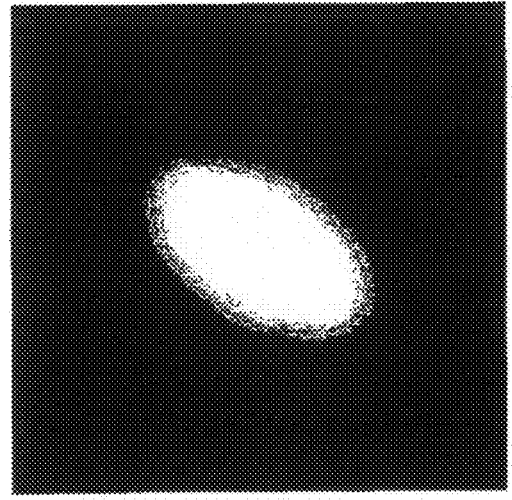

FIG. 3 shows a diffractogram and the low-frequency fractions thereof by way of example. Panel a shows the diffractogram, which was taken with tilted illumination on amorphous carbon. Panel b shows the low-frequency fractions of the intensity distribution, from the anisotropic shape of which the defocus spread $\Delta$ can be determined. The low-frequency fractions each show two maxima and two minima on a circular line around the origin. The only unknown variable for describing the deviation between the maxima and minima is the defocus spread $\Delta$.

Since the attenuation function $E_s(g,t)$ for each diffractogram is known from the simultaneous aberration measurement, this contribution to the low-frequency fractions of the diffractogram intensity can be numerically removed by dividing it by $E_s$. This means, Equation (8) produces $$D^*_{LF}(g,t)=D_{LF}(g,t)/E_s^2(g,t). \quad (9)$$

If $B_0(g)$ denotes all rotation-symmetrical additive interfering signals, and $E_0(g)$ denotes all rotation-symmetrical multiplicative interfering signals, then Equation (9) produces, for the evaluation of the useful signal along circular paths having a radius g around the origin of the diffractogram, the following mathematical model for $D^*_{LF}(g,t)$:

$$D^*_{Mod}(g, \varphi, t, \varphi_t) = \quad (10)$$
$$B_0(g) \cdot \exp\{-\kappa \cdot \cos^2[\varphi - \varphi_t]\} \cdot \cosh\left\{-\kappa \cdot \frac{g}{t} \cdot \cos[\varphi - \varphi_t]\right\},$$

$$\kappa = 2(\pi\Delta\lambda)^2 g^2 t^2. \quad (11)$$

In the embodiment of the electron microscope according to the invention, the evaluation unit comprises this mathematical model.

In the selected representation of the model function $D^*_{Mod}(g,\phi,t,\phi_t)$ in polar coordinates, the Fourier space vector g is provided by the magnitude g thereof and an azimuth angle $\phi$ relative to the x-axis of the diffractogram. Likewise, the beam tilt t employed when taking the diffractogram to be evaluated is characterized by a magnitude t and an azimuth angle $\phi_t$. The magnitude t denotes the angle of the beam tilt with respect to the optical axis of the electron microscope, and thus determines the lateral cone surface on which this tilt is located. The tilt azimuth redescribes the orientation of the beam tilt in a plane perpendicular to the optical axis relative to a given reference direction, such as the x-axis of the diffractogram. It selects a tilting direction from the lateral cone surface defined by the magnitude t. In the evaluation of each diffractogram, the respective tilt angle magnitude t and the tilt azimuth $\phi_t$ must be taken into consideration according to the model in Equation (10).

Looking at Equation (10), it is apparent that the terms $B_0(g)$ and $E_0(g)$ are rotation-symmetrical and consequently do not cause any pattern changes during an evaluation on circular paths as additive or multiplicative constants. The remaining exponential term and the cosine hyperbolic term each vary with the tilt angle $\phi_t$ of the respective diffractogram. In these two terms, all variables g, $\phi$, t, $\phi_t$ and $\lambda$ considered are known. In addition to the parameters $B_0(g)$ and $E_0(g)$ constant on a circular path, only the defocus spread $\Delta$ remains as a parameter of the model function to be fitted to the experimental low-frequency data varying with ($\phi-\phi_t$).

Figure 4:
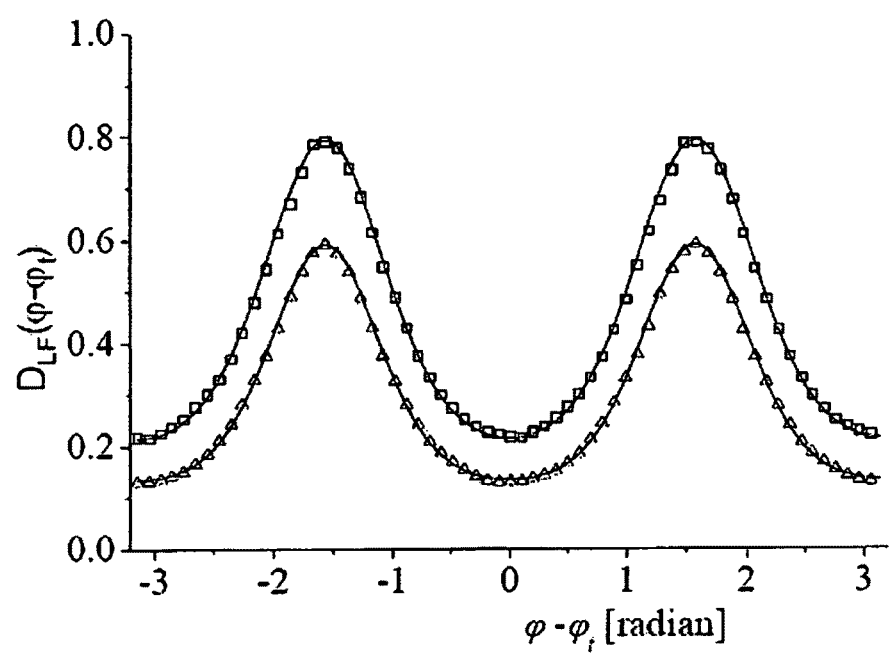
FIG. 4: Experimental low-frequency fractions of a diffractogram for two exemplary circular paths.

FIG. 4 shows experimental low-frequency data $D^*_{LF}$ for two exemplary circular paths. The data points taken on a circular path having the radius $g=3$ nm$^{-1}$ have been marked with squares. The data points taken on a circular path having the radius $g=3.5$ nm$^{-1}$ have been marked with triangles. In these examples, the model function according to Equation (10) was fitted to the experimental data using a non-linear method for minimizing the least squares by varying the parameters $B_0(g)$, $E_0(g)$ and $\Delta$. However, any other fitting method can also be employed. The fitted model function is shown for both radii by a continuous line.

Example Measurement and Accuracy Estimation

FIG. 5 shows a series of diffractograms taken with different beam tilts. The beam tilts were selected in keeping with an azimuth tilt series, such that the angle of the tilted electron beam with respect to the optical axis of the electron microscope is the same in each diffractogram, while the azimuth angles of the beam tilt are distributed in an equidistant manner in a plane perpendicular to the optical axis. Panel a shows the original diffractograms. Panel b shows the low-frequency fractions $D_{LF}$ of these diffractograms. These fractions clearly reflect the dependency of the narrowing of the envelopes on the azimuthal direction of the beam tilt. By averaging the measurement results of the individual diffractograms across such an azimuth tilt series, the influence of fixed object-specific systematic errors on the end result is reduced. In particular, systematic anisotropic errors that distort the measurement result from an individual diffractogram are eliminated. Causes of such systematic errors can be object drift and influences of the object geometry. These likewise result in anisotropic narrowing of the intensity distribution in the diffractogram, but unlike the useful signal they do not consistently follow the beam tilt. By including an entire diffractogram series, the signal fractions (useful signal) varying with the known tilt azimuth $\phi_t$ can be separated from the constant fractions (interfering signal).

The diffractogram series shown in FIG. 5 can also be used to determine aberrations, for example by using the method of the applicant that is the subject matter of the German patent application 10 2006 038 211.0. In this manner, all aberrations, which are required for understanding the spatial attenuation function $E_s(g,t)$, can be notably determined.

Figure 6A:
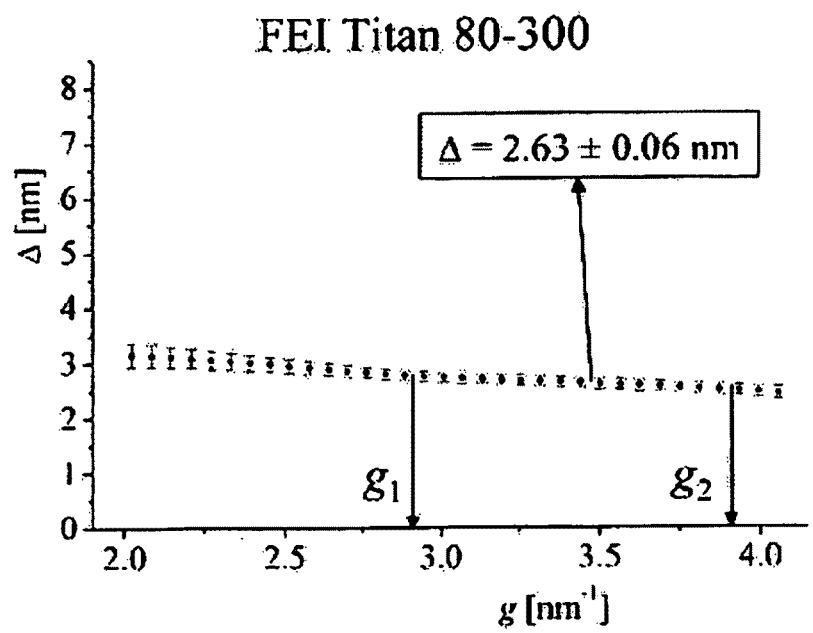
FIG. 6: Application of the method according to the invention to two different electron microscopes.
Figure 6B:
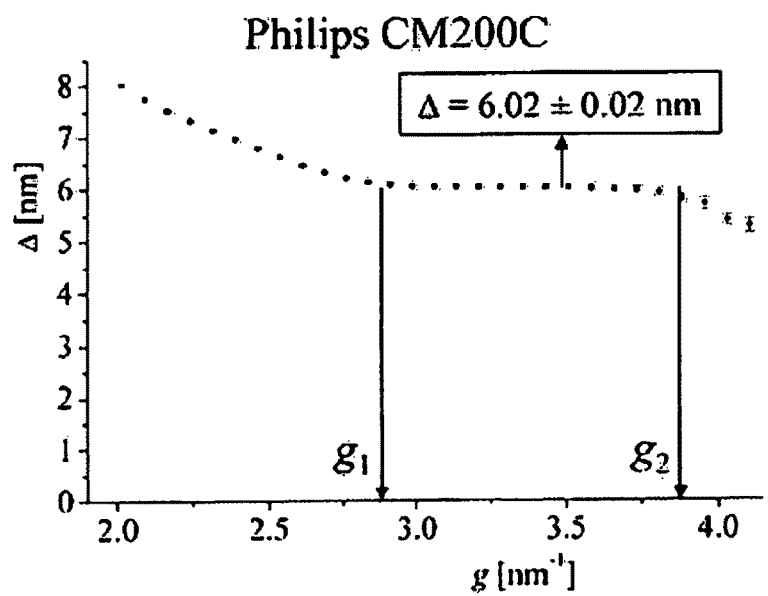

FIG. 6 shows the results of two applications of the method according to the invention in two different transmission electron microscopes. In panel a, the method was applied to the FEI Titan 80-300, and in panel b to the Philips CM200C by the Ernst Ruska Center at the Julich Research Institute. Each data point corresponds to an evaluation of Equations (10) and (11) on a circular path and subsequent averaging across all members of a tilt series of 12 pictures.

For the example of the FEI Titan 80-300 microscope ($\lambda = 1.969 \times 10^{-3}$ nm), the measured value of the defocus spread of $\Delta = 2.63$ nm corresponds to a limiting resolution of $d_{info} = 0.0758$ nm. For the Philips CM200C electron microscope ($\lambda = 2.508 \times 10^{-3}$ nm), according to Equation (2) the measured defocus spread $\Delta = 6.02$ nm results in a limiting resolution of $d_{info} = 0.129$ nm.

The constancy of the defocus spread $\Delta$ over the spatial frequency g expected in theory is found in the measurement result only for circular paths within a defined interval $g_1 \leq g \leq g_2$. In the example measurement described here, $g_1 \approx 3$ nm$^{-1}$ and $g_2 \approx 4$ nm$^{-1}$ apply.

The deviation from the theoretically expected constancy of the parameter $\Delta$ can be explained for the $g < g_1$ range with inelastic contributions to electron scattering and absorption, which are not taken into consideration in the simplified elastic theory that is employed. For spatial frequencies below $g_1$, the model of Equation (4) is invalid for describing the diffractogram intensity. In the range of high spatial frequencies $g > g_2$, the intensity of the useful signal tends to zero. Just before the useful signal disappears, this results in a larger error bar for the fitting of the model function. In addition, the influence of systematic errors intensifies.

The ultimate measurement result for the defocus spread $\Delta$ is determined from the average of all fittings of the model function carried out in the interval $g_1 < g < g_2$ in accordance with Equation (10) to the experimental low-frequency data $D^*_{LF}$ on circular paths. The spatial frequency interval for the averaging step is selected based on the constancy of the measurement values for the defocus spread $\Delta$ and the size of the error bars. In both examples, the error bars are the smallest where the measurement values are constant across g.

The standard deviation from the average of the defocus spread $\Delta$ in the interval $g_1 < g < g_2$ is 0.06 nm and 0.02 nm in the example measurements shown in FIG. 6. In contrast, the accuracy of the method according to the state of the art is estimated to be approximately 0.3 nm, due to the absence of a quantitative accuracy measure. It can therefore be assumed that with the quantitative method disclosed here an improvement in the measuring accuracy of at least a factor of 5 can be achieved compared to the state of the art.

Hereinafter, evaluation of the limiting resolution of the electron microscope via the focus distribution will be addressed, which contrary to evaluation via the defocus spread, is not based on the assumption that the focus distribution is a Gaussian distribution.

Figure 7A:
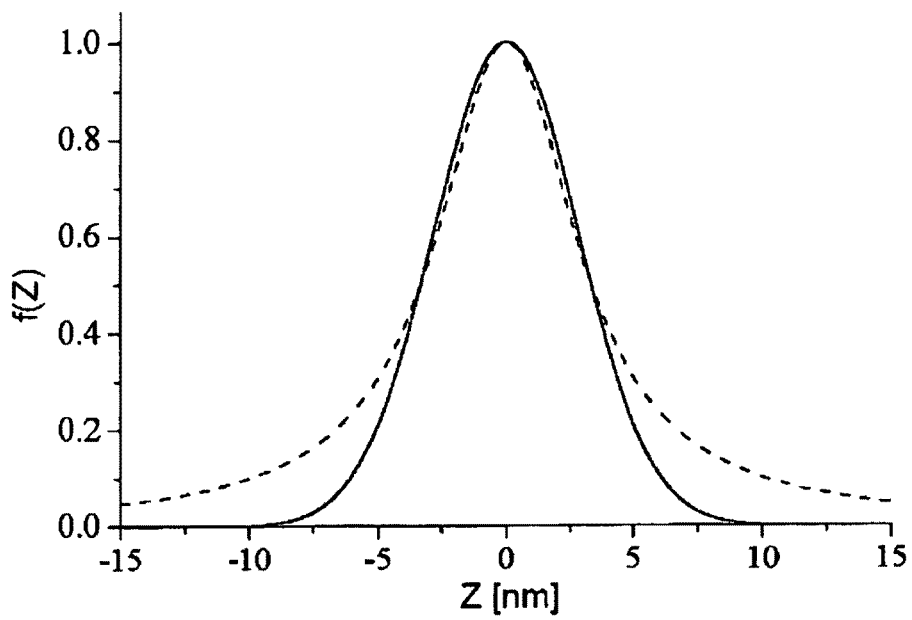
FIG. 7: Focus distributions f (panel a) having identical full width at half maximum, but causing different limiting resolutions, and associated attenuation functions F (panel b).
Figure 7B:
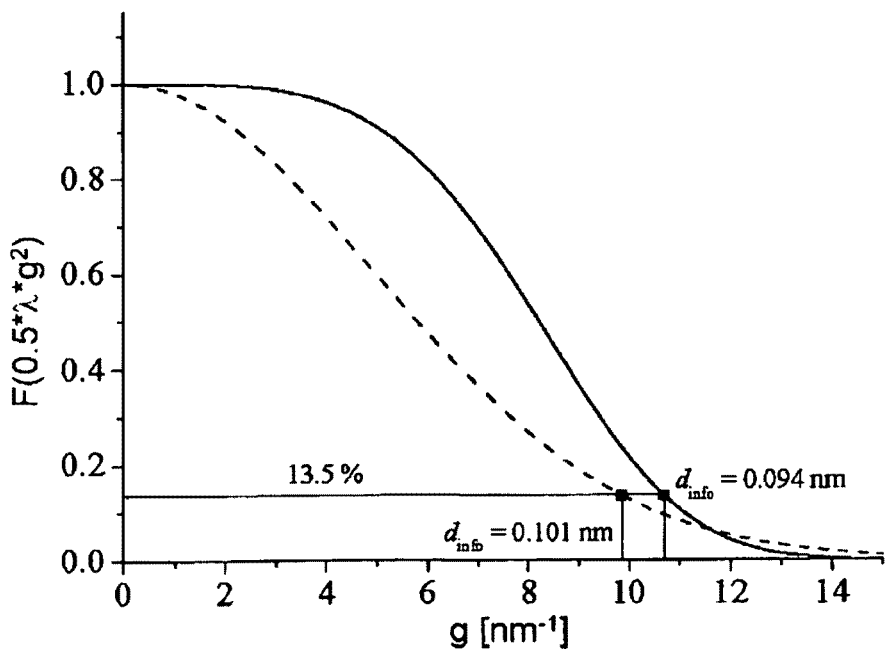

The deviation from the Gaussian distribution becomes particularly large in cases where the emission spectrum of the electron source is subsequently changed by means of a monochromator. An incorrectly assumed model for the focus distribution can result in systematic errors in the determination of the limiting resolution. FIG. 7a shows two examples of focus distributions as a function of the defocus Z, which have identical full widths at half maximum, but cause different limiting resolutions. The difference in the limiting resolutions is apparent from FIG. 7b, which shows the associated attenuation functions F as a function of the spatial frequency g. In FIGS. 7a and 7b, in each case a dotted line describes a Lorentz distribution, and a continuous line describes a Gaussian distribution. The full width half maximum is 4 nm in each case. For the Lorentz distribution, a limiting resolution $d_{info}$ of 0.101 nm is obtained, and for the Gaussian distribution a limiting resolution $d_{info}$ of 0.094 nm is obtained. For the limiting resolution, the attenuation function in each case decreased to 13.5% of the maximum linear contrast $F(0) = 1$.

It is therefore necessary to know the exact course of the focus distribution for the most accurate possible measurement of the limiting resolution.

The resolving power of transmission electron microscopes is traditionally determined by way of diffractograms of thin amorphous objects with central illumination of the object. Thin amorphous objects are used because they have uniform electron scattering in all directions, so that the analysis of the resolving power does not prefer any direction. A diffractogram D(g) constitutes the absolute square of the Fourier transform of a picture. A point in the diffractogram corresponds to a Fourier space vector (diffraction vector) g, which has the dimension of a spatial frequency. Due to the limited resolution of the electron microscope, the intensity of experimental diffractograms for $g = |g| > g_{max}$, where $g_{max} = 1/d_{info}$, can no longer reliably be differentiated from zero. The diffractogram intensity D(g) is represented as $$D(g) = |O(g)|^2 F^2(\tfrac{1}{2}\lambda g^2) E_s^2(g) E_d^2(g). \tag{12}$$

Because the attenuation $F(\tfrac{1}{2}\lambda g^2)$ due to the partial temporal coherence of the electron beam is multiplied with (1) the object function O(g), which describes the diffraction of electrons in the object, (2) the attenuation $E_s(g)$ due to the partial spatial (transversal) coherence of the electron beam, and (3) the modulation transfer function $E_d(g)$ of the detector used for imaging, no absolute reference value exists, which could be used in practice to define a decrease in the diffractogram intensity D(g) to 13.5%.

The method described here is based on the quantitative evaluation of the intensity distribution of diffractograms of electron microscope images with tilted illumination: For illumination with a tilted electron beam, broad focus distribution causes an anisotropic narrowing of the attenuation function F and thus results in an asymmetrical intensity distribution in the diffractogram (see FIGS. 2 and 5a). For a broader focus distribution, which is to say for worse limiting resolution, a stronger anisotropic narrowing of the attenuation function is observed than for a narrower distribution. This narrowing of the attenuation function, which is dependent on the direction of the beam tilt, constitutes the useful signal for the quantification of the focus distribution. For this purpose, the focus distribution is determined on a sufficient number of interpolation nodes, while taking a mathematical model of the electron microscope imaging process into consideration, using a suitable method, such that the experimental data of the useful signal is expressed as part of the model.

The number of interpolation nodes depends on the complexity of the course of the focus distribution to be detected and can be determined accordingly by a person skilled in the art without undue experimentation. If the addition of further interpolation nodes does not result in a qualitative change, this is an indicator that the number of interpolation nodes is sufficient.

The solution is limited to focus distributions f(Z) that are symmetrical with respect to the median point thereof. If the focus distribution acting in the experiment comprises an anti-symmetrical fraction with respect to the median point thereof, this distribution function cannot be determined with the method disclosed here. An anti-symmetrical fraction of the focus distribution occurring in practice, however, is typically very small in relation to the symmetrical fraction, so that the resulting systematic error can generally be ignored. The assumption of a considerable anti-symmetrical fraction additionally violates the entire mathematical concept of an effect of the partial temporal coherence described by real attenuation envelopes, since in this case significant changes in the image contrast also occur, for the description of which complex-valued envelopes would be required, and therefore the notion of mere attenuation would no longer apply. The explanations provided hereinafter are limited to symmetrical focus distributions and the resulting real-valued attenuation envelopes, however, to the knowledge of the inventors, there does not yet exist theoretical formalism for hypothetical complex-valued "attenuation envelopes."

In order to quantify the limiting resolution of a transmission electron microscope, defocused diffractograms of images of a thin amorphous object are analyzed with tilted illumination. By using a thin amorphous object, electrons are scattered with identical probabilities in all directions around the direction of the incident electron beam. The scattering amplitude |O(g)| of the object decreases with large scattering angles. This scattering behavior applies equally to amorphous objects with tilted illumination and with axial illumination. In both cases, the amount of the scattering amplitude in the diffractogram is a rotation-symmetrical function, which decreases with increasing spatial frequency g. In addition to the rotation symmetry of the value of the scattering function, no additional knowledge of the scattering function is required. The absolute value, and the phase of the scattering function, are treated as unknown variables. The method for measuring the limiting resolution is therefore independent of the chemical composition of the thin amorphous object.

The Fourier transform of an electron microscope image of thin amorphous material with tilted illumination can be represented in linear approximation by $$I(g) = O(g) \cdot E_d(g) \cdot E_s(g, t) \cdot \sum_{Z'} f(Z') \cdot \left[ e^{-i\pi\lambda Z'(g^2+2gt)} e^{-i\chi(g+t)+i\chi(t)} - e^{i\pi\lambda Z'(g^2-2gt)} e^{i\chi(-g+t)-i\chi(t)} \right] \quad (13)$$

Figure 5A:
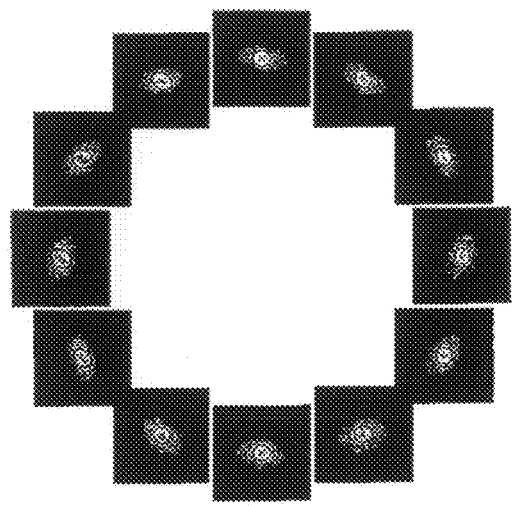
FIG. 5: Series of diffractograms with different beam tilts.

Equation (13) expresses the superimposition of coherent partial images weighted with the missing focal distribution function f(Z) as a discrete sum across focal interpolation nodes. For the graphical representation of the Fourier transform, the absolute square $D(g)=|I/(g)|^2$ is obtained. Such representations are referred to as diffractograms, and some examples are shown in FIGS. 2 and 5a.

In Equation (13), λ denotes the electron wavelength and χ(g) the so-called aberration function. The aberration function $z(g_x,g_y)$) describes the total effect of the coherent optical image defects (aberrations) caused by the imaging device on the electron wave function. In addition to defocusing Z, the spherical aberration $C_s$ and the two components $A_{2x}$ and $A_{2y}$ of the twofold astigmatism are often also taken into consideration in the aberration function. The contribution of the individual aberrations Z, $C_s$, $A_{2x}$ and $A_{2y}$ to the aberration function $\chi(g_x,g_y)$ as a function of the diffraction vector $g=(g_x, g_y)$ is described by Equation (3).

For thin amorphous objects, a diffractogram of a defocused image (which is to say Z≠0) shows a pattern comprising concentric rings, which become narrower as the spatial frequency increases. The distances of the rings depends on the strength Z of defocusing and depends quadratically on the spatial frequency g, see also FIG. 2 and Equation (3). The ring pattern is described by $\sin^2[2\pi\Psi(g_x,g_y)]$. If the coefficients Z, $C_s$, $A_{2x}$ and $A_{2y}$ of the aberrations in Equation (13) are provided when the illumination is not tilted, then the ring pattern varying rapidly with strong defocusing Z over g for illumination by beam tilt t is described by $\sin^2 \chi(g+t)$).

In addition to the ring pattern due to the aberrations, in diffractograms of thin amorphous objects with tilted illumination, as in FIG. 2b, several multiplicative and additive components occur, that vary considerably more slowly in the Fourier space than the ring pattern over the spatial frequency g. These multiplicative, slowly varying components are provided by the object function O(g), the modulation transfer function $E_d(g)$ of the detector, and by the attenuation function $E_s(g,t)$ due to the partial spatial coherence of the electron beam.

The multiplicative spatial attenuation function $E_s(g,t)$ depends explicitly on the diffraction vector g and the beam tilt t. It is provided by Equation (6).

The parameter $\theta_0$ denotes half the aperture angle of the incident beam cone of the illumination. The attenuation due to the partial spatial coherence of the electron beam additionally depends on the gradient of the aberration function χ(g+t) after the diffraction vector g. Since all aberrations considered in the aberration function can be metrologically quantified, such as by the method of the inventors, which is the subject matter of the German patent application 10 2006 038 211.0, the aberration function χ and therefore the spatial attenuation function $E_s(g,t)$ are, in principle, known.

The multiplicative attenuation due to the partial temporal coherence of the electron beam is created by the superimposition of slightly defocused sub-pictures. These can be attributed in each case to individual electrons, which were subjected to different conditions, for example, different initial energies when exiting the electron source, different accelerating voltages, or fluctuations in the lens currents. They are weighted with the missing focus distribution f(Z) as in Equation (13).

Below, three items will be described, which make it easier to determine the focus distribution f(Z), despite lacking knowledge of the amplitude and phase of the object function O(g) and without having knowledge of the real-valued modulation transfer function $E_d(g)$ of the detector. All remaining variables in Equation (13) are then known, except for the missing focus distribution f(Z):

1. The absolute value of the object function |O(g)| and the real-valued modulation transfer function $E_d(g)$ of the detector are rotation-symmetrical functions. The Fourier transform of the image can therefore advantageously be evaluated along concentric circular paths, on which the absolute value of the object function |O(g)| and the modulation transfer $E_d(g)$ are constant factors.
2. The phase of the object function O(g) describes almost exclusively geometric properties of the object. Since, however, the useful signal, the anisotropic narrowing of the intensity distribution in the diffractogram is an amplitude signal that is completely independent of special geometric properties of the object, the phases of the Fourier transform do not play a role in the measurement of the limiting resolution. Therefore, advantageously the value or a function of the value (the value squared, for example) of the Fourier transform of the image can be evaluated.
3. As a result of producing the value, or the value squared, of the Fourier transform, all phase information of the Fourier space is lost. In addition to the geometric object information, which is not useful here, this phase information also comprises information about any anti-symmetrical fraction that may be present in the focus distribution. As a result of producing the value, or the value squared, the information about a possible anti-symmetrical fraction of the focus distribution is lost.

For the determination of f(Z), first a finite set of N focal interpolation nodes $\{Z_0, \ldots Z_i, \ldots Z_N\}$ is defined. Because a symmetrical focus distribution is assumed, it is sufficient to be limited to the positive focus range, which is to say $Z_i \geq 0$. In practice, one can generally define in advance the focal range that the interpolation node set must at least cover in order to describe the decrease in the focus distribution to zero with sufficient accuracy. The number N and the distribution of the N interpolation nodes within this range can be selected so that the shape of the focus distribution is scanned with sufficient accuracy. The number N of the interpolation nodes has an upper limit due to the number of independent experimental data points on a circular path. Depending on the numerical configuration, it is advantageous to define considerably fewer interpolation nodes than independent data points.

For each point on a selected circular path having a radius g around the center of the Fourier space, according to Equation (2) a unique relation exists between the experimental data (|I(g)| or a function of |I(g)|) and the focus distribution f(Z). For a selection of M points $g_j$ on each circular path, therefore a system of M equations is obtained, which comprise N unknown variables $f(Z_i)$. Using a suitable fitting or solution method, such as least squares methods, the values $f(Z_i)$ on each circular path are determined. One can conceive numerical methods for the independent successive evaluation on each individual circular path g=const, as just described, or methods for the simultaneously coupled solution of all circular paths of an individual diffractogram, and even for a simultaneously coupled solution of all circular paths of all diffractograms associated with a diffractogram series.

The discrete focus distribution $f(Z_i)$ can be determined particularly advantageously by solving a system of linear equations, for the preparation of which the diffractogram intensity without the ring pattern caused by coherent aberrations is required. In order to determine the useful signal, the ring pattern interfering for the present purpose is removed from the diffractogram in two key filtration steps as in FIG. 3, wherein only the low-frequency additive and the low-frequency multiplicative fractions of a diffractogram, which form the useful signal, are retained:

1. A low-pass filter is applied to the original diffractogram, whereby the high-frequency ring pattern caused by the aberrations is separated from the low-frequency additive background. The low-frequency background is further processed at a later time as an additive fraction of the useful signal. The high-frequency fraction, which constitutes the product of the high-frequency ring patterns and a multiplicative envelope, is processed in the next step.
2. The logarithm of the amount squared is formed from the high-frequency fraction formed according to step 1. As a result of the logarithmization, the ring pattern and envelope, which originally were coupled multiplicatively, become additive components. With a suitable low-pass filter, which is now applied to the logarithm, the two variables originally multiplicatively coupled in the original data, that is, the ring pattern and envelope, can be separated, whereby the quickly oscillating ring pattern becomes an interfering signal in the high-frequency range of the logarithm, and the desired envelope becomes a useful signal in the low-frequency range of the logarithm. After separating the high-frequency interfering signal (logarithm of the ring pattern), the exponential function is now applied to the low-frequency useful signal (logarithm of the envelope) in order to regain the envelope in the original linear representation. It is now added to the result of the low-pass filtration from step 1 (additive background).

After application of these two fundamental filtration steps, a low-frequency useful signal $l_{LF}(g)$ is available, which is not only free of high-frequency noise, but also opens up a direct possibility to determine the interpolation nodes of the focal distribution function. This useful signal corresponds to the amount from Equation (13), wherein the aberration function $\chi(g+t)-\chi(t)$ in the range of the removed high-frequency ring pattern (interfering signal) is replaced by the constant value $\pi/2$, which corresponds to an idealized microscope having contrast transfer that is independent of aberrations across all spatial frequencies. The filtered useful signal $l_{LF}(g)$ is described by $$l_{LF}(g) = |O(g)| \cdot E_d(g) \cdot E_s(g, t) \cdot \left| \sum_{Z'} f(Z') \cdot \cos[\pi \lambda Z' g^2] \cdot e^{-2\pi i \lambda Z' g t} \right| \quad (14)$$

Since f(Z) is assumed to be a symmetrical function, and $\cos[\pi\lambda Z'g^2]$ is a function symmetrical around Z'0, the imaginary portion of the complex-valued sum in Equation (14) disappears. The useful signal $l_{LF}(g)$ has no zero crossings and the product $|O(g)| \cdot E_d(g) \cdot E_s(g,t)$ is per definition always positive. The real-valued sum across all focal interpolation nodes is accordingly also positive, so that no amount must be formed. Using the abbreviation $A(g)=|O(g)| \cdot E_d(g)$, a linear equation is obtained $$I_{LF}(g) = A(g) \cdot E_s(g,t) \cdot \sum_{Z'} f(Z') \cdot \cos[\pi\lambda Z' g^2] \cdot \cos[2\pi\lambda Z' g t]. \quad (15)$$

On concentric circular paths around g=0, the product of the object function and camera transfer function $A(g)=|O(g)| \cdot E_d(g)$ is a constant, and the spatial envelope $E_s(g,t)$ is a known function. For each circular path selected according to the conditions described above, a system of linear equations can thus be prepared, which can be solved with respect to the missing interpolation node values $f(Z_i)$ with particularly low computation effort.

By averaging across a selection of several circular paths, statistical errors in the solution for $f(Z_i)$ can be minimized. In the selection of the circular paths it should be taken into consideration that the attenuation in the direction of the beam tilt t should be so strong that a ring pattern can no longer be detected on the original diffractogram, while the ring pattern in the direction perpendicular thereto should be clearly visible. In this way, circular paths exist that cover the entire focal frequency range from small values (no attenuation) to large values (full attenuation). By scanning the useful signal $l_{LF}(g)$ on such a circular path, the focal frequency range required for describing the attenuation envelope is completely captured. If no such circular path can be defined in a diffractogram, greater beam tilt should be used when taking the image.

Furthermore, the average of the results for the distribution function $f(Z_i)$ should advantageously be determined from several electron microscope images with illumination using differently tilted electron beams. In this way, systematic error sources resulting from object geometry and sample drift can be reduced.

EXAMPLE MEASUREMENT

Figure 5B:
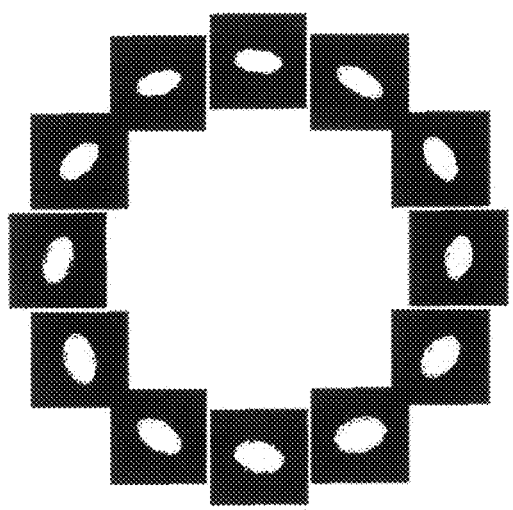

A fitted low-pass filter is applied to the diffractograms of a series of electron microscope images with beam tilts aligned along a circle, having equal angles of tilt with respect to the optical axis of the microscope (see FIG. 5a). The resulting low-frequency fractions of the diffractograms qualitatively look as shown in FIG. 5b. They clearly reflect the dependency of the narrowing of the envelopes on the azimuthal direction of the beam tilt. By averaging the measurement results of the individual diffractograms across such an azimuth tilt series, the influence of fixed object-specific and object drift-specific systematic errors on the end result is reduced.

Figure 8A:
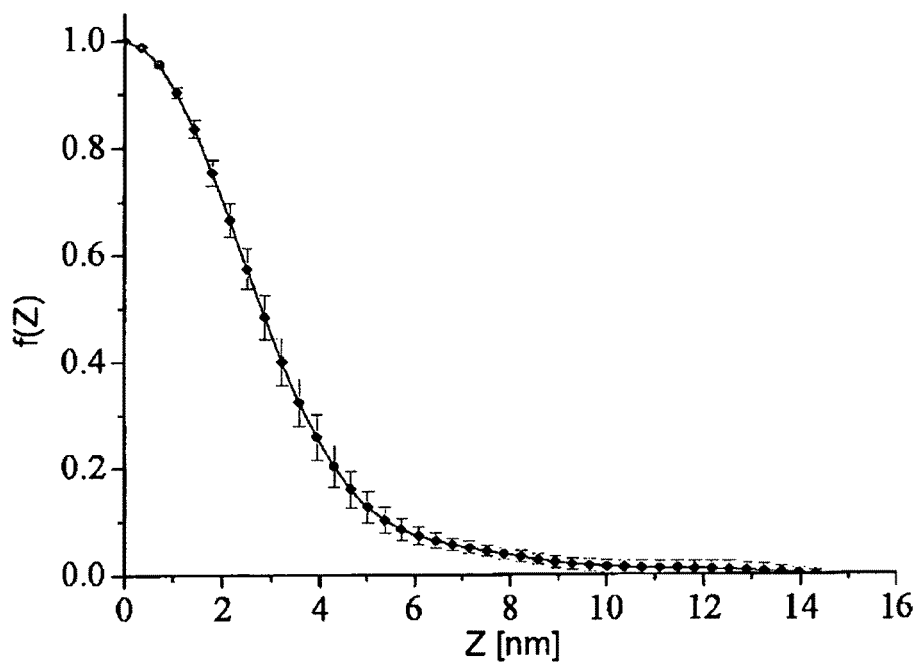
FIG. 8: Focus distribution (panel a) and attenuation function (panel b) determined by way of the method according to the invention for the 300 kV Titan 80-300 microscope from FEI.
Figure 8B:
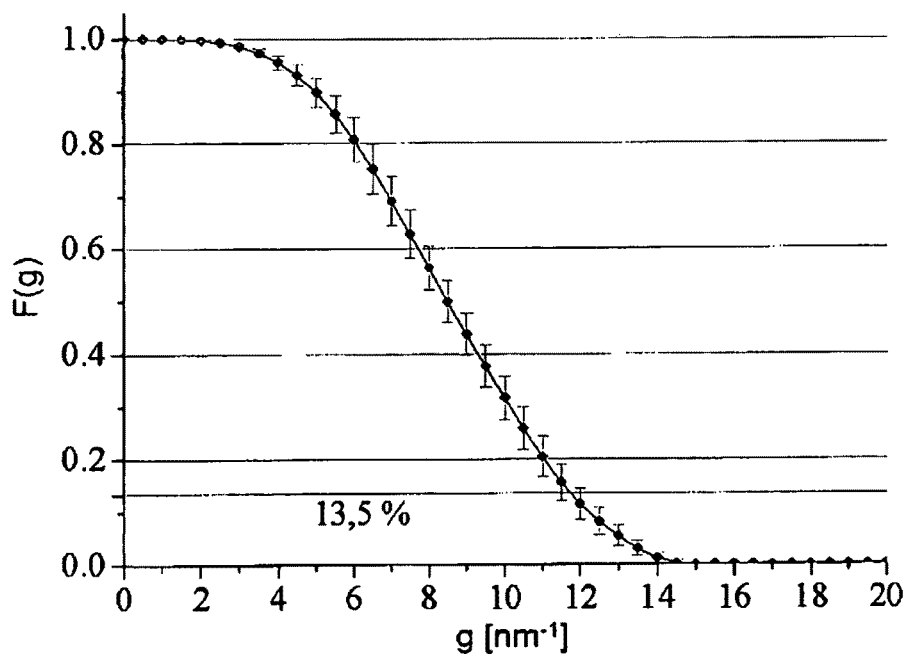

The entire method was applied in two different transmission electron microscopes. FIG. 8a shows the measured focus distribution as a function of defocusing Z, and FIG. 8b shows the attenuation function F(g) determined therefrom as a function of the spatial frequency g for the example of the 300 kV FEI Titan 80-300 microscope ($\lambda=1.969\times10^{-3}$ nm) with a beam tilt of 40 mrad. The attenuation function decreases to 13.5% at a spatial frequency of 11.8 nm$^{-1}$. This corresponds to a limiting resolution of $d_{info}=0.085$ nm.

Figure 9A:
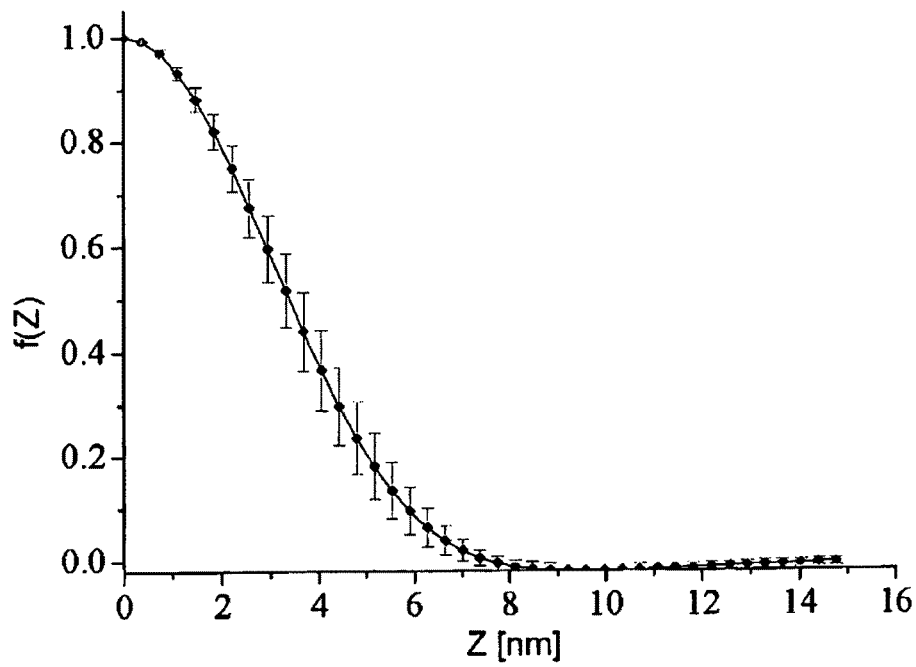
FIG. 9: Focus distribution (panel a) and attenuation function (panel b) determined by way of the method according to the invention for the 200 kV CM-200 electron microscope from Philips.
Figure 9B:
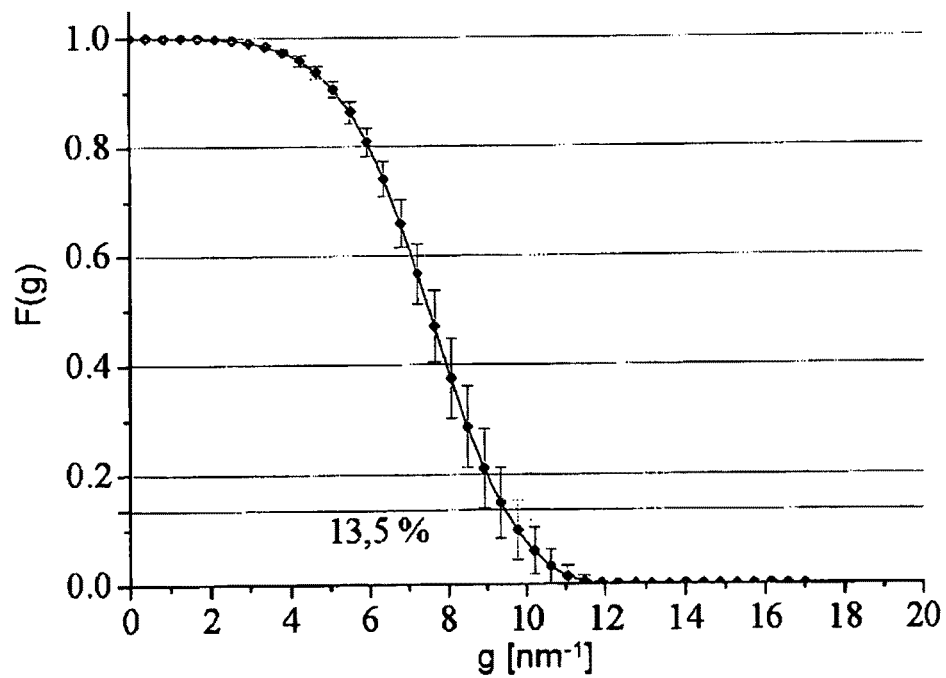

For the 200 kV Philips CM-200 electron microscope ($\lambda=2.508\times10^3$ nm), a limiting resolution of $d_{info}=0.106$ nm is obtained for a beam tilt of 40 mrad from the measured focus distribution F(Z) (FIG. 9a) and the attenuation function f(g) determined therefrom (FIG. 9b).

Accuracy of the Method

The accuracy of the method will be discussed hereinafter based on statistical on systematic errors. The robustness in the practical applications, or more precisely, the behavior with a poor signal-to-noise ratio, also plays a role in analyzing the errors.

Information with respect to the statistical accuracy of the method is derived from the mutual statistical deviations of the determined limiting resolution among all evaluated circular paths of all diffractograms of a beam tilt series. Statistical errors are substantially caused by the noise present in the images.

The standard deviation from the average of the limiting resolution is 0.004 nm and 0.011 nm in the example measurements shown in FIGS. 8 and 9. In contrast, the statistical accuracy of the traditional method of the visual Young's fringe image is roughly estimated to be approximately 0.03 nm due to the absence of a quantitative accuracy measure. Accordingly, on a purely statistical basis, an improvement in the measuring accuracy of at least a factor of 3 can be achieved by the quantitative method disclosed here.

Additionally, it has recently been shown that the traditional Young's fringe method may have serious systematic errors, which can amount to as much as 50% of the limiting resolution. This is due, among other things, to the ignoring the contribution of non-linear contrast in the diffractograms, and misjudgment of the contribution of the unknown "round envelopes" to contrast attenuation. Computer simulations using synthetic non-linear pictures conducted exclusively for this purpose showed that the method disclosed here is very robust toward interfering non-linear contrast fractions, and that the resulting systematic error is only marginally greater than the statistical error. In addition, the method described here is completely immune to a misjudgment of "round envelopes" due to the evaluation on circular paths. As far as the systematic errors mentioned above are concerned, the method described here is therefore clearly superior to the Young's fringe method.

Compared to an evaluation of only the defocus spread, equivalent statistical accuracy is achieved with the evaluation of the focus distribution if the signal-to-noise ratio is good. The evaluation of the focus distribution, however, has considerably fewer systematic errors, especially if the focus distribution is not a Gaussian distribution.

Evaluation of only the defocus spread should, however, be preferred if the signal quality of the input data is poor, which, in practice, cannot always be avoided. Since here only a single parameter is determined, namely the defocus spread based on a fixed Gaussian distribution model, the method, from the start, has no degrees of freedom to find solutions with input data sets which are critical with respect to the signal-to-noise ratio, which follow the noise too closely or deviate strongly from the signal. The robustness of this method with respect to noise is then preferable to the ability to determine the exact focus distribution.

The evaluation of the focus distribution offers an advantage over evaluating the defocus spread alone if the experimental noise is so low that a difference between different distribution functions is also actually reflected in the recorded data set. It should be possible to differentiate different focus distributions from each other. However, since measurements of the limiting resolution are rarely required, it takes less effort to use a high-quality sample for this purpose, which provides a good signal-to-noise ratio. In such a case, evaluation of the focus distribution allows for a considerably more accurate measurement of the limiting resolution with respect to systematic errors.

In the case of focus distributions that deviate strongly from a Gaussian function, as they can occur when using monochromators, it is advantageous to determine the focus distribution independently of a worsening of the accuracy by noise.

The invention claimed is:

1. An electron microscope that delivers an image that is a superimposition of subimages with different defocussing Z, the subimages of the image being due to partial coherence of an electron beam, comprising
    means for tilting the electron beam,
    means for determining anisotropy of an intensity distribution of diffractograms, wherein said tilting of the partially coherent electron beam causes asymmetrical narrowing of the diffractogram intensity distributions, and
    an evaluation unit comprising means for determining either one or both of frequency distribution f(Z) with which the subimages of the defocussing Z contribute to the image delivered by the electron microscope, or broadness of the frequency distribution f(Z) with which the subimages of the defocussing Z contribute to the image delivered by the electron microscope.

2. The electron microscope according to claim 1, comprising means for determining at least one aberration of the electron microscope.

3. The electron microscope according to claim 2, comprising means for determining at least one aberration from the group consisting of defocusing, spherical aberration, or astigmatism.

4. An electron microscope according to claim 1, wherein the electron microscope is configured as a transmission electron microscope.

5. An electron microscope according to claim 1, comprising at least one logarithmizing unit.

6. An electron microscope according to claim 1, wherein said evaluation unit comprises a mathematical model for the intensity distribution of the diffractogram.

7. An electron microscope according to claim 1, wherein the evaluation unit further comprises means for evaluating anisotropic change of an envelope of the diffractogram.

8. An electron microscope according to claim 7, wherein the evaluation unit further comprises means for evaluating anisotropic narrowing of an envelope of a coherent ring pattern of the diffractogram after said evaluating of anisotropic change.

9. An electron microscope that delivers an image that is a superimposition of subimages with different defocussing Z, the subimages of the image being due to partial coherence of an electron beam, comprising:
    means for tilting the electron beam;
    means for determining anisotropy of an intensity distribution of diffractograms; and
    an evaluation unit comprising means for determining either one or both of frequency distribution f(Z) with which subimages of defocussing Z contribute to an image delivered by the electron microscope, or broadness of the frequency distribution f(Z) with which the subimages of the defocussing Z contribute to the image delivered by the electron microscope;
    wherein said evaluation unit comprises a low-pass filter for the diffractogram.

10. A method for determining a defocus spread and limiting resolution of an electron microscope that delivers an image that is a superimposition of subimages with different defocussing Z, the subimages of the image being due to partial coherence of an electron beam, comprising the steps of:
    tilting the electron beam;
    taking at least one diffractogram for an object;
    determining anisotropy of an intensity distribution of this diffractogram, wherein said tilting of the partially coherent electron beam causes asymmetrical narrowing of the diffractogram intensity distribution;
    determining the defocus spread and the limiting resolution of the electron microscope from an anisotropic narrowing of envelopes of the diffraction and the tilting of the electron beam, wherein the defocus spread is a frequency distribution f(Z) with which the subimages of the defocussing Z contribute to the image delivered by the electron microscope; and
    determining broadness of the broadness of the frequency distribution f(Z) with which the subimages of the defocussing Z contribute to the image delivered by the electron microscope.

11. The method according to claim 10, wherein the limiting resolution of the electron microscope is evaluated from the defocus spread or from the focus distribution.

12. A method according to claim 10, wherein an amorphous object is selected.

13. A method according to claim 10, wherein at least one aberration of the electron microscope is determined.

14. The method according to claim 13, wherein at least one aberration from the group consisting of defocusing, spherical aberration, or astigmatism is determined.

15. A method according to claim 13, wherein the aberration is measured.

16. A method according to claim 13, wherein the aberration is imparted to the electron microscope at a known strength.

17. A method according to claim 10, wherein a transmission electron microscope is selected as the microscope.

18. A method according to claim 10, wherein the diffractogram is logarithmized.

19. A method according to claim 10, wherein the diffractogram is evaluated along a circular line around the origin thereof.

20. A method according to claim 10, wherein a mathematical model of the intensity distribution of the diffractogram is fitted to the diffractogram taken.

21. The method according to claim 20, wherein the defocus spread of the electron microscope is used as a fitting parameter.

22. A method according to claim 20, wherein the fitting is carried out using a parameter optimization method.

23. A method according to claim 10, wherein a sequence of at least three diffractograms, taken at different beam tilts, is evaluated.

24. The method according to claim 23, wherein the sequence is taken with beam tilts having a constant angle with respect to the optical axis and a uniform distribution of the tilt angle azimuths.

25. A method according to claim 10, wherein an equation system having M equations and N unknown variables is prepared for evaluating the focus distribution, in which for the number M of discrete points in the diffractogram the intensity value of the diffractogram at this point is expressed as a function of the values of the focus distribution at the number N of different sub-focuses of a picture.

26. The method according to claim 25, wherein a linear equation system is prepared.

27. A method according to claim 10, further comprising evaluating anisotropic change of an envelope of the diffractogram.

28. A method according to claim 27, further comprising after said evaluating, evaluating anisotropic narrowing of an envelope of a coherent ring pattern of the diffractogram.

29. A method for determining defocus spread or limiting resolution of an electron microscope that delivers an image that is a superimposition of subimages with different defocussing Z, the subimages of the image being due to partial coherence of an electron beam, comprising the steps of:

tilting the electron beam;

taking at least one diffractogram for an object;

determining anisotropy of an intensity distribution of this diffractogram; and determining the defocus spread or focus distribution of the electron microscope from an anisotropic narrowing of envelopes of the diffraction and the tilting of the electron beam;

wherein the diffractogram is filtered by a low-pass filter, wherein the defocus spread is a frequency distribution f(Z) with which the subimages of the defocussing Z contribute to the image delivered by the electron microscope, and wherein the focus dispersion is broadness of the broadness of the frequency distribution f(Z) with which the subimages of the defocussing Z contribute to the image delivered by the electron microscope.

30. A method for determining defocus spread of an electron microscope, wherein defocus spread is defocus among a plurality of superimposed sub-pictures forming an image a picture being taken by the electron microscope, the sub-pictures having different defocussing Z due to partial coherence of an electron beam, comprising the steps of:

tilting the partially coherent electron beam of the electron microscope;

deriving at least one diffractogram of an object, which is being imaged, by diffracting the electron beam;

determining anisotropy of an intensity distribution of said at least one diffractogram; and evaluating anisotropic change among envelopes of the diffracted and tilted electron beam, said anisotropic change occurring among the plurality of sub-pictures forming the picture being taken of said object due at least in part to said partial coherence of the electron beam;

evaluating defocus spread as the defocus among the plurality of superimposed sub-pictures forming the picture being taken of the object, wherein the defocus spread is a frequency distribution f(Z) with which the sub-pictures defocussing Z contribute to the picture delivered by the electron microscope; and evaluating defocus dispersion as a broadness of the frequency distribution f(Z) with which the sub-pictures defocussing Z contribute to the picture delivered by the electron microscope.

31. A method according to claim 30, wherein said evaluating anisotropic change is an evaluation of anisotropic change along an azimuthal direction among said envelopes.

32. A method according to claim 31, further comprising evaluating anisotropic narrowing of an envelope of a coherent ring pattern of the at least one diffractogram after said evaluating of anisotropic change.

33. An electron microscope for taking a picture of an image, wherein the picture is a superimposition of a plurality of sub-pictures with different defocussing Z, the sub-pictures of the picture being due to partial coherence of an electron beam, comprising:

means for tilting the electron beam, means for deriving at least one diffractogram of an object, which is being imaged, by diffracting the electron beam means for determining anisotropy of an intensity distribution of said at least one diffractogram; and an evaluation unit comprising:

means for evaluating anisotropic change among envelopes of the diffracted and tilted electron beam, said anisotropic change occurring among the plurality of sub-pictures forming the picture being taken of said object due to said partial coherence of the electron beam;

means for evaluating defocus spread as defocus among the plurality of superimposed sub-pictures forming the picture being taken of the object, wherein the defocus spread is a frequency distribution f(Z) with which the sub-pictures defocussing Z contribute to the picture delivered by the electron microscope; and means for evaluating defocus dispersion as a broadness of the frequency distribution f(Z) with which the sub-pictures defocussing Z contribute to the picture delivered by the electron microscope.

34. An electron microscope according to claim 33, wherein said means for evaluating anisotropic change comprises means for evaluating anisotropic change along an azimuthal direction among said envelopes.

35. An electron microscope according to claim 34, wherein said evaluation unit further comprises means for evaluating anisotropic narrowing of an envelope of a coherent ring pattern of the at least one diffractogram after said evaluating of anisotropic change.

* * * * *